United States Patent
Li

(10) Patent No.: US 9,437,729 B2
(45) Date of Patent: Sep. 6, 2016

(54) HIGH-DENSITY POWER MOSFET WITH PLANARIZED METALIZATION

(75) Inventor: Jian Li, Palo Alto, CA (US)

(73) Assignee: Vishay-Siliconix, Santa Clara, CA (US)

( * ) Notice: Subject to any disclaimer, the term of this patent is extended or adjusted under 35 U.S.C. 154(b) by 641 days.

(21) Appl. No.: 11/651,258

(22) Filed: Jan. 8, 2007

(65) Prior Publication Data
US 2008/0164515 A1    Jul. 10, 2008

(51) Int. Cl.
H01L 21/3205    (2006.01)
H01L 29/78    (2006.01)
H01L 29/417    (2006.01)
H01L 21/306    (2006.01)
H01L 29/45    (2006.01)

(52) U.S. Cl.
CPC ..... *H01L 29/7813* (2013.01); *H01L 29/41741* (2013.01); *H01L 29/7806* (2013.01); *H01L 21/30625* (2013.01); *H01L 29/456* (2013.01); *H01L 2224/05624* (2013.01); *H01L 2924/12032* (2013.01); *H01L 2924/13091* (2013.01)

(58) Field of Classification Search
USPC .......................... 257/329, 330; 438/272, 586
See application file for complete search history.

(56) References Cited

U.S. PATENT DOCUMENTS

| | | | |
|---|---|---|---|
| 3,906,540 A | 9/1975 | Hollins | |
| 4,641,174 A | 2/1987 | Baliga | |
| 4,672,407 A | 6/1987 | Nakagawa et al. | |
| 4,782,372 A | 11/1988 | Nakagawa et al. | |
| 4,799,095 A | 1/1989 | Baliga | |
| 4,823,172 A | 4/1989 | Mihara | |
| 4,827,321 A | 5/1989 | Baliga | |
| 4,857,986 A | 8/1989 | Kinugawa | |
| 4,928,155 A | 5/1990 | Nakagawa et al. | |
| 4,939,557 A | 7/1990 | Pao et al. | |
| 4,967,243 A | 10/1990 | Baliga et al. | |
| 4,969,027 A | 11/1990 | Baliga et al. | |
| 5,021,840 A | 6/1991 | Morris | |
| 5,055,896 A | 10/1991 | Williams et al. | |
| 5,072,266 A | 12/1991 | Bulucea et al. | |
| 5,111,253 A | 5/1992 | Korman et al. | |
| 5,168,331 A | 12/1992 | Yilmaz | |
| 5,191,395 A | 3/1993 | Nishimura | |

(Continued)

FOREIGN PATENT DOCUMENTS

CN    101180737    5/2008
DE    4 208 695 A1    9/1992

(Continued)

OTHER PUBLICATIONS

Masakatsu Hoshi et al., "A DMOSFET Having a Cell Array Field Ring for Improving Avalanche Capability", May 18, 1993, IEEE, Proceedings of the 5th International Symposium on Power Semiconductor Devices and ICs (ISPSD), Monterey, California, May 18-20, 1993, pp. 141-145, XP000380145.

(Continued)

*Primary Examiner* — Marvin Payen

(57) ABSTRACT

A method for producing a power MOSFET. The method includes fabricating a plurality of layers of a power MOSFET to produce an upper surface active area and performing a chemical mechanical polishing process on the active area to produce a substantially planar surface. A metalization deposition process is then performed on the substantially planar surface and the fabrication of the power MOSFET is subsequently completed.

15 Claims, 7 Drawing Sheets

(56) References Cited

U.S. PATENT DOCUMENTS

| | | | |
|---|---|---|---|
| 5,221,850 A | 6/1993 | Sakurai | |
| 5,233,215 A | 8/1993 | Baliga | |
| 5,245,106 A | 9/1993 | Cameron et al. | |
| 5,366,914 A | 11/1994 | Takahashi et al. | |
| 5,378,655 A | 1/1995 | Hutchings et al. | |
| 5,387,528 A | 2/1995 | Hutchings et al. | |
| 5,430,315 A | 7/1995 | Rumennik | |
| 5,525,821 A | 6/1996 | Harada et al. | |
| 5,527,720 A | 6/1996 | Goodyear et al. | |
| 5,567,634 A | 10/1996 | Hebert et al. | |
| 5,578,508 A | 11/1996 | Baba et al. | |
| 5,602,424 A | 2/1997 | Tsubouchi et al. | |
| 5,621,234 A | 4/1997 | Kato | |
| 5,648,283 A | 7/1997 | Tsang et al. | |
| 5,689,128 A | 11/1997 | Hshieh | |
| 5,696,396 A | 12/1997 | Tokura et al. | |
| 5,770,878 A | 6/1998 | Beasom | |
| 5,808,340 A | 9/1998 | Wollesen et al. | |
| 5,814,858 A | 9/1998 | Williams | |
| 5,877,538 A | 3/1999 | Williams | |
| 5,965,904 A | 10/1999 | Ohtani et al. | |
| 5,998,836 A | 12/1999 | Williams | |
| 5,998,837 A | 12/1999 | Williams | |
| 6,049,108 A | 4/2000 | Williams et al. | |
| 6,096,584 A | 8/2000 | Ellis-Monaghan et al. | |
| 6,140,678 A | 10/2000 | Grabowski et al. | |
| 6,153,896 A | 11/2000 | Omura et al. | |
| 6,168,996 B1 | 1/2001 | Numazawa et al. | |
| 6,172,398 B1 | 1/2001 | Hshieh | |
| 6,180,966 B1 | 1/2001 | Kohno et al. | |
| 6,204,533 B1 | 3/2001 | Williams et al. | |
| 6,211,018 B1 | 4/2001 | Nam et al. | |
| 6,238,981 B1 | 5/2001 | Grebs | |
| 6,245,615 B1 | 6/2001 | Noble et al. | |
| 6,268,242 B1 | 7/2001 | Williams et al. | |
| 6,277,695 B1 | 8/2001 | Williams et al. | |
| 6,285,060 B1 | 9/2001 | Korec et al. | |
| 6,348,712 B1 | 2/2002 | Korec et al. | |
| 6,351,009 B1 | 2/2002 | Kocon et al. | |
| 6,359,308 B1 | 3/2002 | Hijzen et al. | |
| 6,391,721 B2 | 5/2002 | Nakagawa | |
| 6,413,822 B2 | 7/2002 | Williams et al. | |
| 6,483,171 B1 | 11/2002 | Forbes et al. | |
| 6,489,204 B1 | 12/2002 | Tsui | |
| 6,495,883 B2 | 12/2002 | Shibata et al. | |
| 6,498,071 B2 | 12/2002 | Hijzen et al. | |
| 6,580,123 B2 | 6/2003 | Thapar | |
| 6,580,154 B2 | 6/2003 | Noble et al. | |
| 6,642,109 B2 | 11/2003 | Lee et al. | |
| 6,661,054 B1 | 12/2003 | Nakamura | |
| 6,700,158 B1 | 3/2004 | Cao et al. | |
| 6,710,403 B2 | 3/2004 | Sapp | |
| 6,717,210 B2 | 4/2004 | Takano et al. | |
| 6,756,274 B2 | 6/2004 | Williams et al. | |
| 6,764,889 B2 | 7/2004 | Baliga | |
| 6,770,539 B2 | 8/2004 | Sumida | |
| 6,825,105 B2 | 11/2004 | Grover et al. | |
| 6,861,701 B2 | 3/2005 | Williams et al. | |
| 6,903,393 B2 | 6/2005 | Ohmi et al. | |
| 6,919,610 B2 | 7/2005 | Saitoh et al. | |
| 6,927,455 B2 | 8/2005 | Narazaki | |
| 6,960,821 B2 | 11/2005 | Noble et al. | |
| 6,987,305 B2 | 1/2006 | He et al. | |
| 7,224,022 B2 | 5/2007 | Tokano et al. | |
| 7,361,952 B2 | 4/2008 | Miura et al. | |
| 7,375,029 B2 | 5/2008 | Poelzl | |
| 7,397,083 B2 | 7/2008 | Amali et al. | |
| 7,449,354 B2 | 11/2008 | Marchant et al. | |
| 7,521,306 B2 | 4/2009 | Kubo et al. | |
| 7,541,642 B2 | 6/2009 | Kawamura et al. | |
| 7,544,568 B2 | 6/2009 | Matsuura et al. | |
| 7,663,195 B2 | 2/2010 | Ohmi et al. | |
| RE41,509 E | 8/2010 | Kinzer et al. | |
| 7,910,486 B2 | 3/2011 | Yilmaz et al. | |
| 7,964,913 B2 | 6/2011 | Darwish | |
| 8,080,459 B2 | 12/2011 | Xu | |
| 2001/0026006 A1 | 10/2001 | Noble et al. | |
| 2001/0026989 A1 | 10/2001 | Thapar | |
| 2002/0036319 A1 | 3/2002 | Baliga | |
| 2002/0038887 A1 | 4/2002 | Ninomiya et al. | |
| 2002/0074585 A1 | 6/2002 | Tsang et al. | |
| 2002/0123196 A1 | 9/2002 | Chang et al. | |
| 2002/0130359 A1 | 9/2002 | Okumura et al. | |
| 2003/0030092 A1 | 2/2003 | Darwish et al. | |
| 2003/0201483 A1 | 10/2003 | Sumida | |
| 2004/0016959 A1 | 1/2004 | Yamaguchi et al. | |
| 2004/0021174 A1 | 2/2004 | Kobayashi | |
| 2004/0155287 A1 | 8/2004 | Omura et al. | |
| 2004/0161886 A1 | 8/2004 | Forbes et al. | |
| 2004/0173844 A1 * | 9/2004 | Williams et al. | 257/329 |
| 2005/0001268 A1 | 1/2005 | Baliga | |
| 2005/0026369 A1 | 2/2005 | Noble et al. | |
| 2005/0029585 A1 * | 2/2005 | He et al. | 257/330 |
| 2005/0079678 A1 | 4/2005 | Verma et al. | |
| 2005/0167695 A1 | 8/2005 | Yilmaz | |
| 2005/0184336 A1 | 8/2005 | Takahaski | |
| 2005/0266642 A1 | 12/2005 | Kubo et al. | |
| 2006/0014349 A1 | 1/2006 | Williams et al. | |
| 2006/0108635 A1 | 5/2006 | Bhalla et al. | |
| 2006/0113577 A1 | 6/2006 | Ohtani | |
| 2006/0113588 A1 | 6/2006 | Wu | |
| 2006/0226494 A1 | 10/2006 | Hshieh | |
| 2006/0267090 A1 | 11/2006 | Sapp et al. | |
| 2006/0273383 A1 | 12/2006 | Hshieh | |
| 2006/0285368 A1 * | 12/2006 | Schlecht | 363/21.06 |
| 2007/0007589 A1 | 1/2007 | Nakagawa | |
| 2007/0013000 A1 | 1/2007 | Shiraishi | |
| 2007/0023828 A1 | 2/2007 | Kawamura et al. | |
| 2007/0138546 A1 | 6/2007 | Kawamura et al. | |
| 2007/0155104 A1 | 7/2007 | Marchant et al. | |
| 2007/0249142 A1 | 10/2007 | Hisanaga | |
| 2008/0099344 A9 | 5/2008 | Basol et al. | |
| 2008/0135931 A1 | 6/2008 | Challa et al. | |
| 2008/0164515 A1 | 7/2008 | Li | |
| 2008/0173969 A1 | 7/2008 | Hebert et al. | |
| 2008/0185640 A1 | 8/2008 | Nakagawa | |
| 2008/0246081 A1 | 10/2008 | Li et al. | |
| 2009/0140327 A1 | 6/2009 | Hirao et al. | |
| 2009/0159963 A1 | 6/2009 | Yamaguchi et al. | |
| 2009/0166740 A1 | 7/2009 | Bhalla et al. | |
| 2010/0055892 A1 | 3/2010 | Poelzl | |
| 2010/0059797 A1 | 3/2010 | Ngai et al. | |
| 2010/0181606 A1 | 7/2010 | Takaishi | |
| 2011/0049614 A1 | 3/2011 | Gao et al. | |
| 2011/0053326 A1 | 3/2011 | Gao et al. | |
| 2011/0089486 A1 | 4/2011 | Xu et al. | |
| 2012/0187474 A1 | 7/2012 | Rexer et al. | |
| 2012/0313161 A1 | 12/2012 | Grivna et al. | |
| 2012/0326229 A1 | 12/2012 | Poelzl et al. | |
| 2014/0206165 A1 | 7/2014 | Li et al. | |

FOREIGN PATENT DOCUMENTS

| | | |
|---|---|---|
| DE | 102004036330 | 3/2005 |
| DE | 112005003584 | 4/2008 |
| EP | 0 133 642 A1 | 3/1985 |
| EP | 0354449 | 2/1990 |
| EP | 0 438 700 A1 | 7/1991 |
| EP | 0 583 022 A2 | 2/1994 |
| EP | 0 583 028 A1 | 2/1994 |
| EP | 0620588 | 10/1994 |
| EP | 0628337 | 12/1994 |
| EP | 0 746 030 A2 | 12/1996 |
| EP | 1 033 759 A2 | 9/2000 |
| EP | 1186023 | 3/2002 |
| EP | 1351313 | 10/2003 |
| EP | 1376674 | 1/2004 |
| EP | 1403914 | 3/2004 |
| GB | 2 269 050 A | 1/1994 |
| JP | 62-298152 | 12/1987 |
| JP | H03-173180 | 7/1991 |
| JP | H05-315620 | 11/1993 |
| JP | H06-350090 | 12/1994 |
| JP | H09-129877 | 5/1997 |

(56) References Cited

FOREIGN PATENT DOCUMENTS

| | | |
|---|---|---|
| JP | H10-032331 | 5/1997 |
| JP | H09-260645 | 10/1997 |
| JP | H10-214809 | 8/1998 |
| JP | 2000-091344 | 3/2000 |
| JP | 2000-332246 | 11/2000 |
| JP | 2002-016080 | 1/2002 |
| JP | 2002-110978 | 4/2002 |
| JP | 2002-134705 | 5/2002 |
| JP | 2002-222950 | 8/2002 |
| JP | 2002-246596 | 8/2002 |
| JP | 2002-368221 | 12/2002 |
| JP | 2002-373988 | 12/2002 |
| JP | 2003030396 | 1/2003 |
| JP | 2003-515954 | 5/2003 |
| JP | 2003-324196 | 11/2003 |
| JP | 2004-134793 | 4/2004 |
| JP | 2004-522319 | 7/2004 |
| JP | 2005-142240 | 6/2005 |
| JP | 2005-524970 | 8/2005 |
| JP | 2005-268679 | 9/2005 |
| JP | 2006-339558 | 12/2006 |
| JP | 2007027561 | 2/2007 |
| JP | 2007-189192 | 7/2007 |
| JP | 2008-042056 | 2/2008 |
| JP | 2009-004411 | 1/2009 |
| JP | 2009-043966 | 2/2009 |
| JP | 2009-522807 | 6/2009 |
| TW | 490853 B | 6/2002 |
| TW | I302028 B | 10/2008 |
| WO | 0065646 | 11/2000 |
| WO | 0141206 | 6/2001 |
| WO | 0199177 | 12/2001 |
| WO | 03010812 | 2/2003 |
| WO | 2004105116 | 12/2004 |
| WO | 2006025035 | 3/2006 |
| WO | 2006058210 | 6/2006 |
| WO | 2006126998 | 11/2006 |
| WO | 2007002857 | 1/2007 |
| WO | 2008156071 A1 | 12/2008 |

OTHER PUBLICATIONS

"Effects on Selecting Channel Direction in Improving Performance of Sub-100 nm MOSFETs Fabricated on (110) Surface Si Substrate" Japanese Journal of Applied Physics, Part 1, vol. 13, No. 4B, Apr. 2004 pp. 1723-1728 (Nakamura et al), XP00122768.

Hattori, et al. Design of a 200V Super Junction MOSFET With N-Buffer Regions and Its Fabrication by Trench Filling; Proceedings of 2004 International Symposium on Power Semiconductor Devices & ICS, Kitakyusus; 2004.

\* cited by examiner

HIGH-DENSITY POWER MOSFET WITH PLANARIZED METALIZATION

TECHNICAL FIELD

The present invention relates to high-density power MOSFET semiconductor devices.

BACKGROUND ART

Power MOSFETs (metal-oxide-semiconductor field-effect transistors) comprise one of the most useful field effect transistors implemented in both analog and digital circuit applications.

In general, a trench-based power MOSFET is built using a vertical structure as opposed to a planar structure. The vertical structure enables the transistor to sustain both high blocking voltage and high current. Similarly, with a vertical structure, the component area is roughly proportional to the current it can sustain, and the component thickness is proportional to the breakdown voltage.

The geometry of the features of the power MOSFET components are commonly defined photographically through photolithography. The photolithography process is used to define component regions and build up components one layer on top of another. Complex devices can often have many different built up layers, each layer having components, each layer having differing interconnections, and each layer stacked on top of the previous layer. The resulting topography of these complex devices often resemble familiar terrestrial "mountain ranges", with many "hills" and "valleys" as the device components are built up on the underlying surface of the silicon wafer.

There exists a problem, however, in the fact that prior art power MOSFET components have active areas with a considerable amount of topography. The active areas of the prior art power MOSFET devices have many hills and valleys from the layered components built up on the underlying silicon. To enable component interconnects, this topography is covered by a thick metalization layer that is optimized to fill in the valleys and cover the peaks. This metalization layer is typically more than several microns thick (e.g., in common high-density power MOSFET devices).

The thick metalization layer leads to number problems. One problem is the fact that even though the metalization layer is designed to fill in the valleys, there can exist voids where the valleys are too narrow to allow effective filling. Such voids become prime areas for the introduction of flaws into the completed power MOSFET device. Another problem is the fact that the deposition of such a thick metalization layer is a very expensive step in the fabrication process. Accordingly, what is needed is a power MOSFET fabrication process that avoids the thick metalization layer problems on planarized topography services.

DISCLOSURE OF THE INVENTION

Embodiments of the present invention provide a method and system for high density power MOSFETs that avoid the thick metalization layer problems of the prior art. Embodiments of the present invention eliminate the occurrence of voids in completed devices due to high aspect ratio gaps in their active area surfaces.

In one embodiment, the present invention is implemented as a method for producing a high density power MOSFET. The method includes fabricating a plurality of layers of a power MOSFET to produce an upper surface active area and performing a CMP (chemical mechanical polishing) process on the active area to produce a substantially planar surface. A metalization deposition process is then performed on the substantially planar surface and the fabrication of the power MOSFET is subsequently completed. In one embodiment, a metal layer deposited by the metalization deposition process is less than 4 microns thick. The CMP process thus eliminates problems posed by, for example, high aspect ratio surfaces characteristic in the fabrication of high density power MOSFET devices.

In one embodiment, a CMP process is used to achieve planarized topography on a power MOSFET device having both small geometry (e.g., such as source contacts) and large geometry (e.g., such as gate contacts) simultaneously. This aspect can also apply to power MOSFETs with integrated Schottky devices.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE EMBODIMENTS

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Embodiments of the present invention are directed towards a high density power MOSFET having a substantially planarized upper surface active area with a thin metalization layer. Embodiments of the present invention are further directed towards methods for fabricating the high density power MOSFETs. In one embodiment, the method includes fabricating a plurality of layers of a power MOSFET to produce an upper surface active area and performing a CMP (chemical mechanical polishing) process on the active area to produce a substantially planar surface. A metalization deposition process is then performed on the flat substantially planar surface and the fabrication of the power MOSFET is subsequently completed. In one embodiment, a metal layer deposited by the metalization deposition process is less than 4 microns thick. Embodiments of the present invention and their benefits are further described below.

Figure 1:
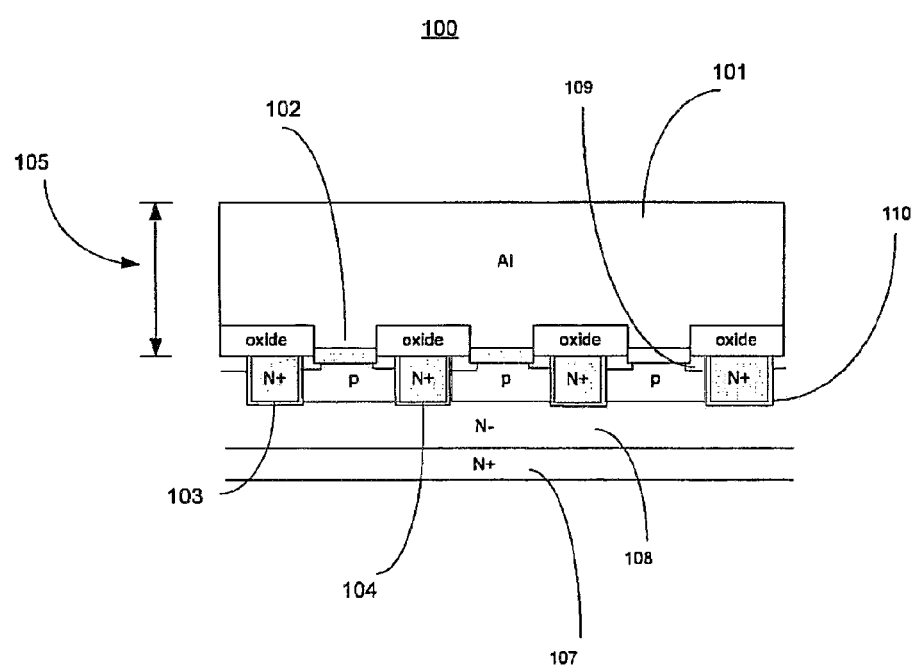
FIG. 1 shows a schematic cross-section view of a conventional power MOSFET having a comparatively thick metalization layer.

FIG. 1 shows a schematic cross-section view of a conventional power MOSFET 100 having a comparatively thick aluminum metalization layer 101. As depicted in FIG. 1, the cross-section view of the power MOSFET 100 shows a plurality of gate contacts (e.g., contact 102) between a respective plurality of source drain regions (e.g., 103-104) and the n-type and p-type doping of the intrinsic silicon. Each source drain region (e.g., 103-104) is surrounded by an oxide layer (e.g., SiO$_2$) as shown by the exemplary oxide layer 110. An n+ region (region 109) is on either side of each of the source drain regions. The well regions N– 108 and N+ 107 are shown. The FIG. 1 embodiment shows the metalization layer 101 being comparatively thick, in this case, having a thickness 105 of approximately 5 µm. The thick metalization layer 101 is deposited to effectively cover and fill the topography of the underlying active area surface. The metalization layer 101 is intended to fill the regions between the depicted oxide deposits and make an effective adhesion with the gate contacts (e.g., contact 102). The metalization layer 101 has an un-even surface due to the fact of its thickness. The metalization deposition for the 5 µm thick metalization layer 101 adds a significant expense to the fabrication process of the power MOSFET 100. For example, wafers would need to spend a significant amount of time within, for example, a vapor metalization deposition machine, forming a metalization layer of the required thickness. The increased time spent within the deposition machine reduces the machine's overall throughput, and the overall throughput of the fabrication process, thereby increasing the unit cost of the MOSFET devices.

Figure 2:
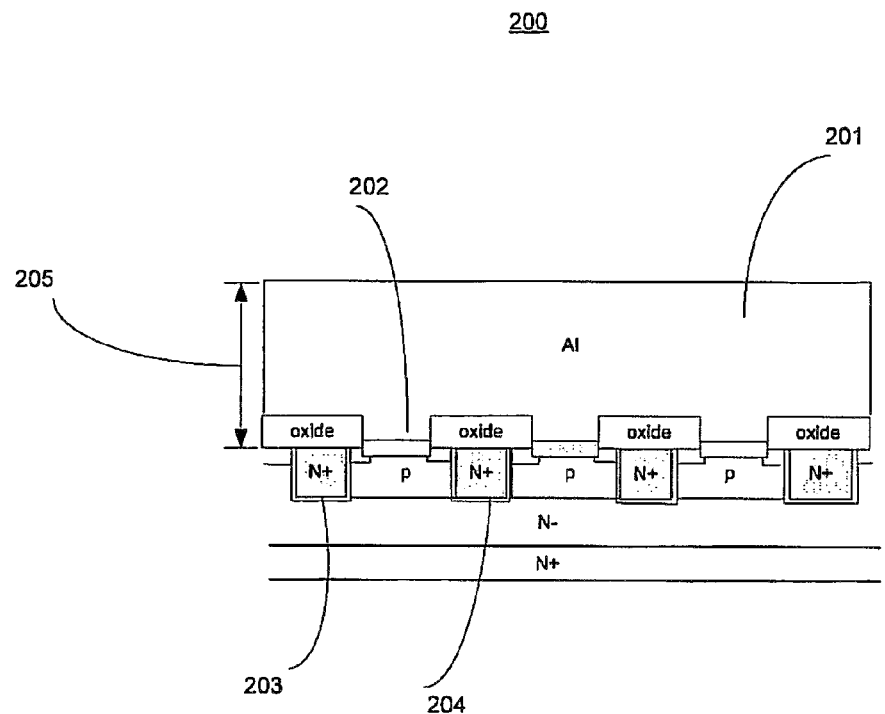
FIG. 2 shows a schematic cross-section view of a high density power MOSFET having a comparatively thick metalization layer 201.

FIG. 2 shows a schematic cross-section view of a high density power MOSFET 200 having a comparatively thick metalization layer 201. In a manner similar to the FIG. 1 diagram, FIG. 2 shows a schematic cross-section view of the high density power MOSFET 200, showing a plurality of gate contacts (e.g., contact 202) between a respective plurality of source drain regions (e.g., 203-204) and the n-type and p-type doping of the intrinsic silicon. As with FIG. 1, the FIG. 2 embodiment shows the metalization layer 201 being comparatively thick, in this case, approximately 5 µm. The thick metalization layer 201 is deposited to effectively cover and fill the topography of the underlying active area surface, however the metalization layer 201 has the added challenge of having to fill high aspect ratio valleys between the shown oxide deposits. Since the power MOSFET 200 is a high density power MOSFET, the width of the gaps between the source-drain oxide deposits is smaller across the area of the die in comparison to lower density power MOSFETs (e.g., MOSFET 100 of FIG. 1).

The metalization layer 201 has the more challenging task in that it needs to fill the high aspect ratio regions between the depicted oxide deposits while still making an effective adhesion with the gate contacts (e.g., contact 202). The high aspect ratio regions present an additional difficulty to the metalization deposition process.

Figure 3:
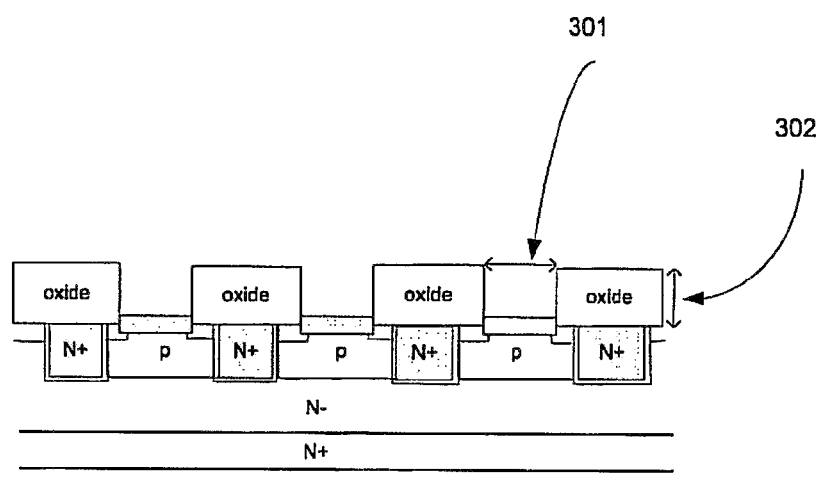
FIG. 3 shows a diagram illustrating the aspect ratio of the high density power MOSFET.

FIG. 3 shows a diagram illustrating the aspect ratio of the high density power MOSFET 200. The aspect ratio refers to the ratio between the width of a gap (e.g., width 301) and the depth of the gap (e.g., the depth of 302). Generally, an aspect ratio is higher for narrow gaps that are relatively deep as opposed to wide gaps that are relatively shallow. For a high density power MOSFET 200, ensuring effective filling of the high ratio gaps and therefore ensuring effective contact with the source contacts (e.g., contact 202) becomes more problematic, and thus often requires an even thicker metalization deposition layer 201. Even with the additional thickness in the metalization layer 201, the high aspect ratio gaps can lead to voids and similar types of non-filling defects. Such voids can lead to outgassing and similar types of faults in the completed high density power MOSFET 200. Thus, the metalization layer 201 can be even more expensive than the metalization layer 101 shown in FIG. 1.

Figure 4:
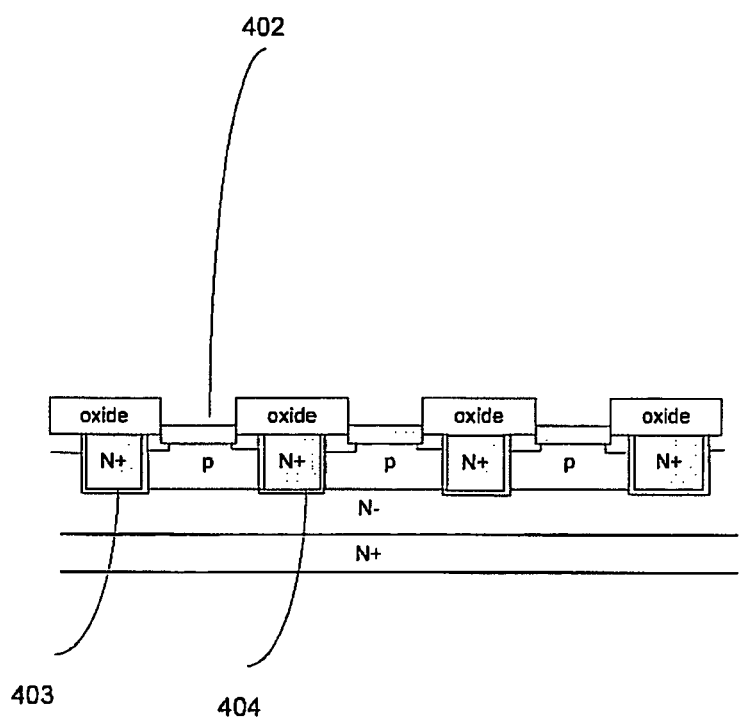
FIG. 4 shows a diagram depicting a high density power MOSFET in accordance with one embodiment of the present invention prior to a planarization process being performed on the upper active area surface.

FIG. 4 shows a diagram depicting a high density power MOSFET 400 in accordance with one embodiment of the present invention prior to a planarization process being performed on the upper active area surface. As depicted in FIG. 4, the cross-section view of the power MOSFET 400 shows a plurality of gate contacts (e.g., contact 402) between a respective plurality of source drain regions (e.g., 403-404) and the n-type and p-type doping of the intrinsic silicon. In the MOSFET 400 embodiment of FIG. 4, the gate contacts are tungsten gate contacts.

Figure 5:
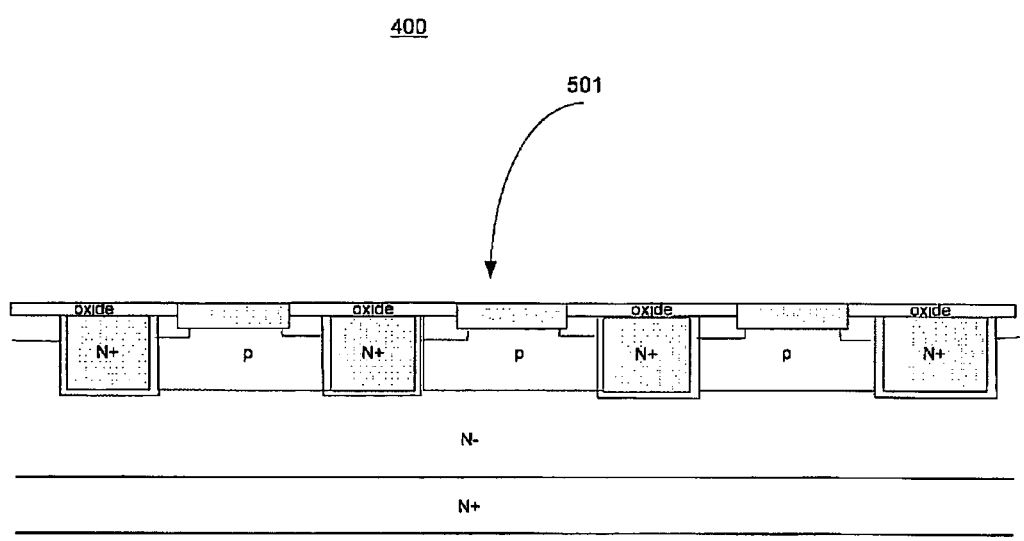
FIG. 5 shows a diagram depicting a high density power MOSFET in accordance with one embodiment of the present invention subsequent to a planarization process being performed on the upper active area surface.

FIG. 5 shows a diagram depicting a high density power MOSFET 400 in accordance with one embodiment of the present invention subsequent to a planarization process being performed on the upper active area surface. As depicted in FIG. 5, the cross-section view of the power MOSFET 400 shows the upper surface active area of 501 after it has been planarized. As depicted in FIG. 5, the Oxide deposits and the tungsten contacts have been polished until they are coplanar. The flat upper surface active area effectively removes any gaps, regardless of their aspect ratio, that must be filled by a subsequent metalization deposition. This makes the subsequent metalization deposition much more efficient.

In one embodiment, the planarization process used on the upper surface active area 501 is a tungsten optimized CMP process. Such a tungsten optimized CMP process is configured to ensure effective polishing of active areas having both Oxide sub-areas and tungsten sub-areas.

Figure 6:
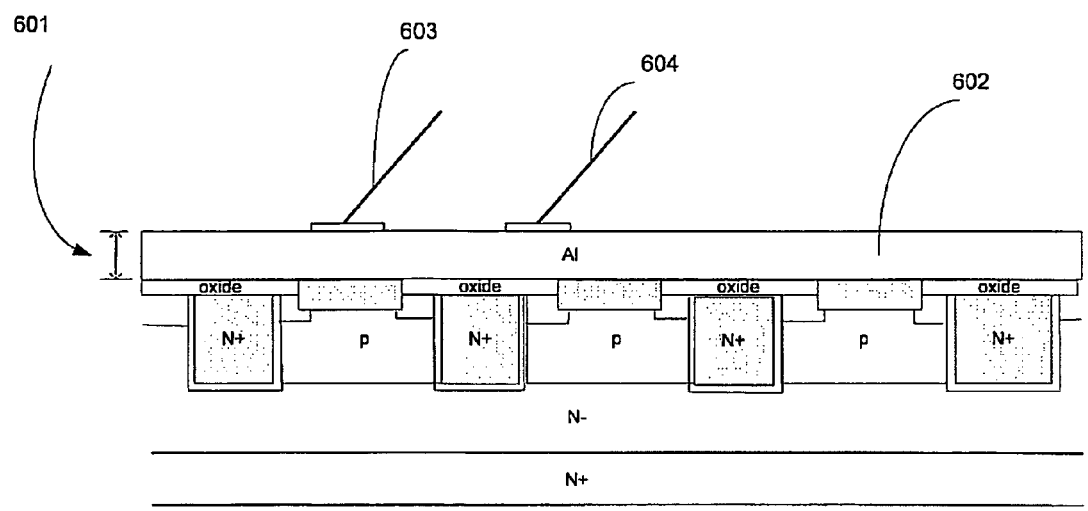
FIG. 6 shows a diagram depicting a high density power MOSFET in accordance with one embodiment of the present invention subsequent to a thin metalization deposition process being performed on the planarized upper active area surface.

FIG. 6 shows a diagram depicting a high density power MOSFET 400 in accordance with one embodiment of the present invention subsequent to a thin metalization deposition process being performed on the planarized upper active area surface. As depicted in FIG. 6, the cross-section view of the power MOSFET 400 shows the upper surface active area covered by a thin aluminum metalization layer 602. The metalization layer 602 is also shown with the contacts 603 and 604. The flat upper surface active area is free of any topography, and thus can be effectively and efficiently filled by a thin metalization deposition. The thin metalization deposition can have a thickness 601 of less than 5 µm. For example, in one embodiment, the thickness 601 is 4 µm. Similarly, in one embodiment, the thickness 601 is 3 µm or less.

The thin metalization deposition for the high-density power MOSFET 400 of the present embodiment is less expensive and consumes less fabrication time than a conventional thicker metalization deposition process. The thin metalization deposition process is also more effective than the conventional thicker metalization deposition since the CMP process removes topography from the upper active area surface, thereby eliminating a significant source of fabrication defects. The CMP process thus prevents the occurrence of problems posed by, for example, high aspect ratio surfaces characteristic in the fabrication of high density power MOSFET devices.

Figure 7:
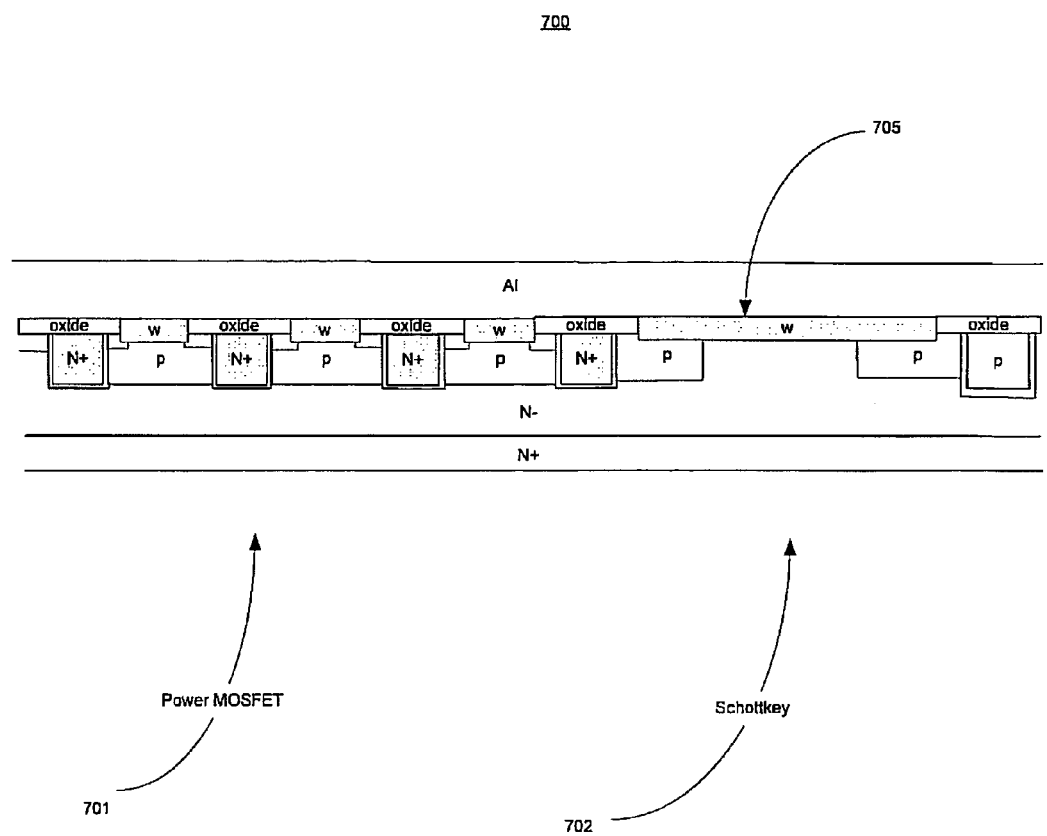
FIG. 7 shows a diagram depicting a high-density power MOSFET with an integrated Schottky device in accordance with one embodiment of the present invention.

FIG. 7 shows a high density power MOSFET with an integrated Schottky device 700 in accordance with one embodiment of the present invention. As depicted in FIG. 7, the device 700 includes its high-density power MOSFET region 701 and its Schottky device 702. In this example this is shown with a comparatively longer 705 region in comparison to the gate regions for the high density power MOSFET.

Additionally, it should be noted that although exemplary N channel devices have been depicted in FIGS. 1 through 7, embodiments of the present invention can be readily implemented using P channel devices instead. Such implementations are within the scope of the present invention.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the claims appended hereto and their equivalents.

What is claimed is:

1. A method for producing a power MOSFET, comprising:
    fabricating a plurality of layers of a power MOSFET and an integrated Schottky device to produce an upper surface active area;
    performing a chemical mechanical polishing process on the upper surface active area to produce a substantially planar surface, wherein a gate contact is coplanar with an oxide deposit, wherein the oxide deposit comprises a source region, and wherein the oxide deposit comprises a drain region;
    performing a metalization deposition process on the substantially planar surface, wherein a portion of the metallization deposition is in contact with the gate contact; and
    completing fabrication of the power MOSFET and Schottky device.

2. The method of claim 1 wherein the active area comprises silicon dioxide sub-areas and tungsten sub-areas.

3. The method of claim 2 wherein the chemical mechanical polishing process comprises a tungsten optimized process.

4. The method of claim 1 wherein the metalization deposition is configured to deposit a metal layer less than 4 microns deep.

5. The method of claim 4 wherein the metal layer is configured to accept a plurality of wire bonds for completing fabrication of the power MOSFET.

6. The method of claim 1 wherein the power MOSFET is a high density power MOSFET.

7. A method for producing a high density power MOSFET, comprising:
    fabricating a plurality of layers of a power MOSFET and an integrated Schottky device to produce an upper surface active area;
    performing a chemical mechanical polishing process on the upper surface active area to produce a substantially planar surface, wherein a gate contact is coplanar with an oxide deposit, wherein the oxide deposit comprises a source region, and wherein the oxide deposit comprises a drain region;
    performing a metalization deposition process on the substantially planar surface, wherein the metalization deposition is configured to deposit a metal layer less than 4 microns deep, wherein a portion of the metallization deposition is in contact with the gate contact; and
    completing fabrication of the power MOSFET and Schottky device.

8. The method of claim 7 wherein the active area comprises silicon dioxide sub-areas and tungsten sub-areas.

9. The method of claim 8 wherein the chemical mechanical polishing process comprises a tungsten optimized process.

10. The method of claim 7 wherein the metalization deposition is configured to deposit a metal layer less than 2 microns deep.

11. The method of claim 10 wherein the metal layer is configured to accept a plurality of wire bonds for completing fabrication of the power MOSFET.

12. The method of claim 7 wherein the upper surface of the active area is a high aspect ratio surface.

13. The method of claim 7 wherein the power MOSFET is an N channel device or a P channel device.

14. The method of claim 7 wherein the integrated Schottky device comprises a region larger than a gate contact region of the power MOSFET.

15. The method of claim 10 wherein the upper surface of the active area is a high aspect ratio surface, and wherein the power MOSFET is an N channel device or a P channel device, and wherein the integrated Schottky device comprises a region larger than a source contact region of the power MOSFET.

* * * * *